United States Patent
Latev et al.

(10) Patent No.: US 9,525,119 B2
(45) Date of Patent: Dec. 20, 2016

(54) FLEXIBLE MICROMACHINED TRANSDUCER DEVICE AND METHOD FOR FABRICATING SAME

(71) Applicants: Dimitre Latev, San Jose, CA (US); Arman Hajati, Santa Clara, CA (US); Darren Todd Imai, Los Gatos, CA (US); Ut Tran, San Jose, CA (US)

(72) Inventors: Dimitre Latev, San Jose, CA (US); Arman Hajati, Santa Clara, CA (US); Darren Todd Imai, Los Gatos, CA (US); Ut Tran, San Jose, CA (US)

(73) Assignee: FUJIFILM DIMATIX, INC., Lebanon, NH (US)

( * ) Notice: Subject to any disclaimer, the term of this patent is extended or adjusted under 35 U.S.C. 154(b) by 304 days.

(21) Appl. No.: 14/103,672

(22) Filed: Dec. 11, 2013

(65) Prior Publication Data
US 2015/0158052 A1    Jun. 11, 2015

(51) Int. Cl.
*B06B 1/02* (2006.01)
*H01L 41/04* (2006.01)
*B06B 1/06* (2006.01)
*H01L 41/047* (2006.01)
*H01L 41/09* (2006.01)
*H01L 41/29* (2013.01)
*B32B 37/18* (2006.01)

(52) U.S. Cl.
CPC .......... *H01L 41/042* (2013.01); *B06B 1/0622* (2013.01); *H01L 41/0475* (2013.01); *H01L 41/098* (2013.01); *H01L 41/29* (2013.01); *B32B 37/185* (2013.01); *B32B 2457/00* (2013.01); *Y10T 156/10* (2015.01)

(58) Field of Classification Search
CPC ...... H01L 41/083; H01L 41/09; H01L 41/042; H02N 2/14; B06B 1/0207
USPC .................... 310/316.01, 328, 330, 331, 335
See application file for complete search history.

(56) References Cited

U.S. PATENT DOCUMENTS

| 5,527,741 A | 6/1996 | Cole et al. |
| 6,584,861 B1 | 7/2003 | Jespersen |

(Continued)

FOREIGN PATENT DOCUMENTS

JP    2001320103    11/2001

OTHER PUBLICATIONS

"PCT, International Search Report and Written Opinion of the International Searching Authority for International Application No. PCT/US2014/043893", (Oct. 14, 2014), Whole Document.

(Continued)

*Primary Examiner* — Shawki S Ismail
*Assistant Examiner* — Bryan Gordon
(74) *Attorney, Agent, or Firm* — Blakely, Sokoloff, Taylor & Zafman LLP

(57) ABSTRACT

Techniques and structures for providing flexibility of a micromachined transducer array. In an embodiment, a transducer array includes a plurality of transducer elements each comprising a piezoelectric element and one or more electrodes disposed in or on a support layer. The support layer is bonded to a flexible layer including a polymer material, wherein flexibility of the transducer array results in part from a total thickness of a flexible layer. In another embodiment, flexibility of the transducer array results in part from one or more flexural structures formed therein.

10 Claims, 16 Drawing Sheets

(56) References Cited

U.S. PATENT DOCUMENTS

| | | | |
|---|---|---|---|
| 6,676,602 B1 | 1/2004 | Barnes et al. | |
| 6,894,425 B1* | 5/2005 | Solomon | B06B 1/0629 |
| | | | 310/334 |
| 7,388,318 B2 | 6/2008 | Yamada et al. | |
| 8,608,672 B2 | 12/2013 | Vortman et al. | |
| 9,096,422 B2 | 8/2015 | Hajati et al. | |
| 2002/0083771 A1 | 7/2002 | Khuri-Yakub et al. | |
| 2003/0187356 A1* | 10/2003 | Wakabayashi | B06B 1/0622 |
| | | | 600/437 |
| 2004/0004649 A1 | 1/2004 | Bibl et al. | |
| 2005/0154312 A1* | 7/2005 | Bruestle | A61B 8/14 |
| | | | 600/459 |
| 2005/0237858 A1 | 10/2005 | Thomenius et al. | |
| 2000/0248238 | 11/2005 | Yamada et al. | |
| 2005/0248235 A1 | 11/2005 | Namerikawa et al. | |
| 2005/0248238 A1 | 11/2005 | Yamada et al. | |
| 2007/0013269 A1 | 1/2007 | Huang | |
| 2007/0259468 A1* | 11/2007 | Chen | H01L 41/337 |
| | | | 438/48 |
| 2008/0042519 A1 | 2/2008 | Marshall et al. | |
| 2008/0048211 A1 | 2/2008 | Khuri-Yakub et al. | |
| 2008/0243001 A1* | 10/2008 | Oakley | A61B 8/4281 |
| | | | 600/459 |
| 2009/0230820 A1 | 9/2009 | Nudelman et al. | |
| 2012/0206014 A1 | 8/2012 | Bibl et al. | |
| 2012/0235539 A1 | 9/2012 | Bibl et al. | |
| 2012/0299439 A1 | 11/2012 | Huang | |
| 2013/0000758 A1 | 1/2013 | Hoen et al. | |

OTHER PUBLICATIONS

"PCT, International Search Report and Written Opinion of the International Searching Authority for International Application No. PCT/US2014/054595", (Dec. 19, 2014), Whole Document.

"PCT, International Search Report and Written Opinion of the International Searching Authority for International Application No. PCT/US2014/065964", (Feb. 23, 2015), Whole Document.

Non-Final Office Action from U.S. Appl. No. 14/045,713 mailed Feb. 26, 2016, 15 pgs.

Non-Final Office Action from U.S. Appl. No. 13/972,814 mailed Feb. 22, 2016, 10 pgs.

International Preliminary Report on Patentability from PCT/US2014/043893 mailed Mar. 3, 2016, 11 pgs.

International Preliminary Report on Patentability from PCT/US2014/054595 mailed Apr. 14, 2016, 10 pgs.

International Preliminary Report on Patentability for PCT International Application No. PCT/US2014/065964 mailed Jun. 23, 2016, 6 pgs.

* cited by examiner

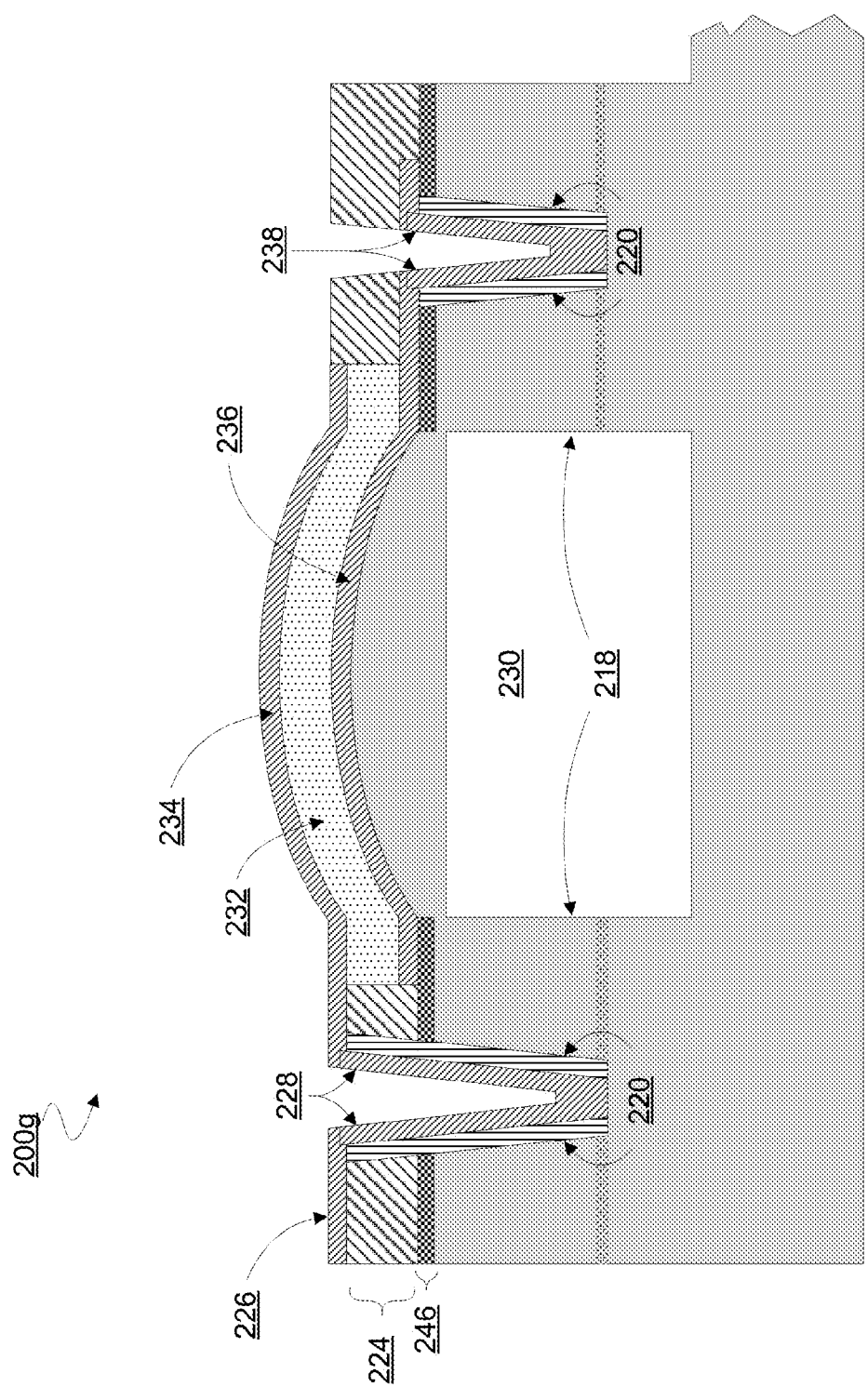

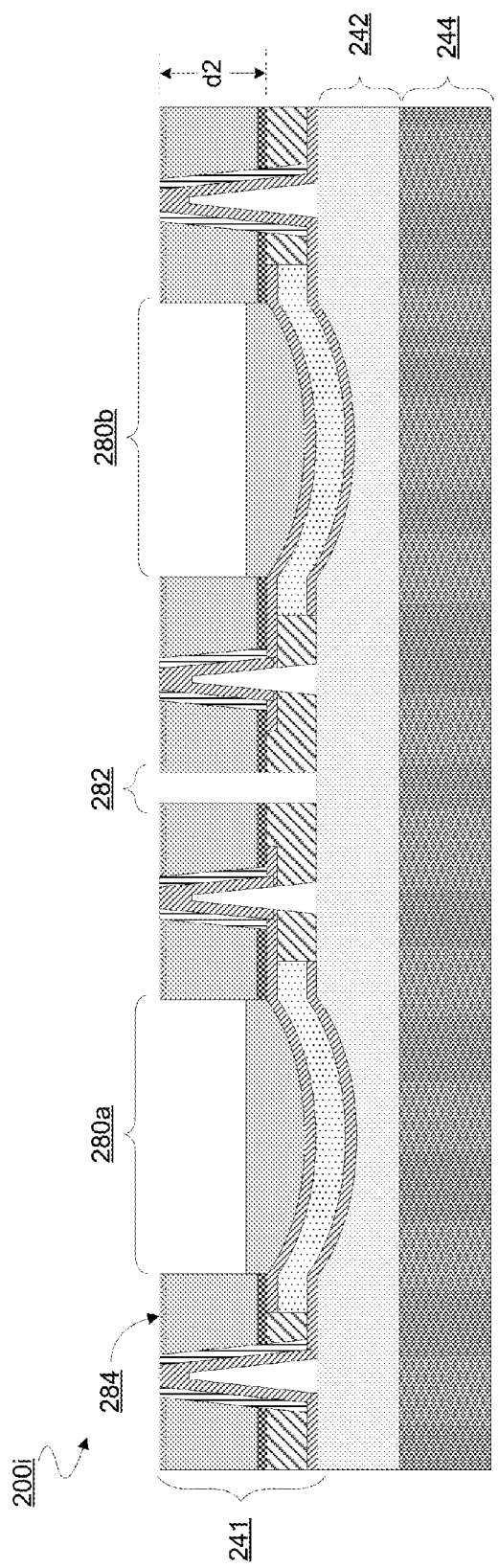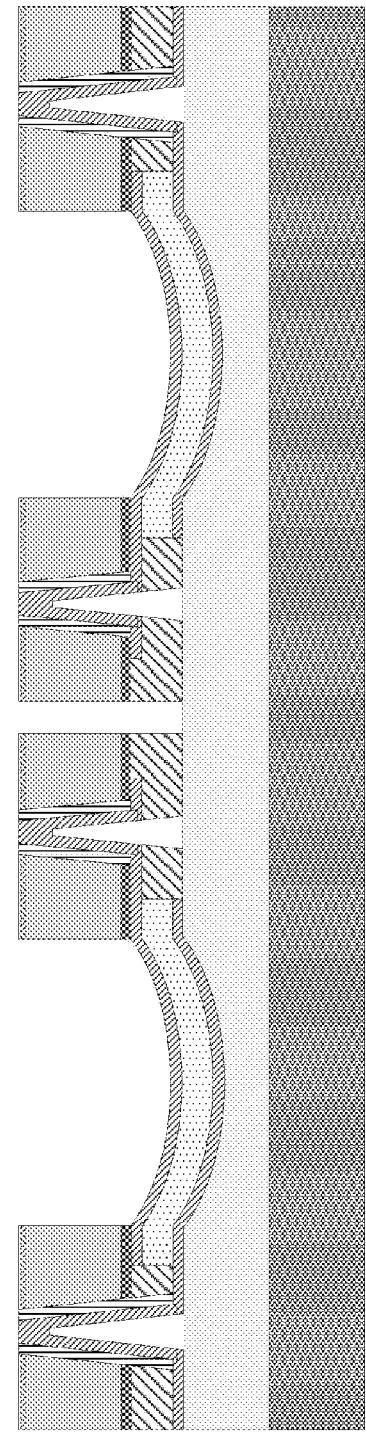

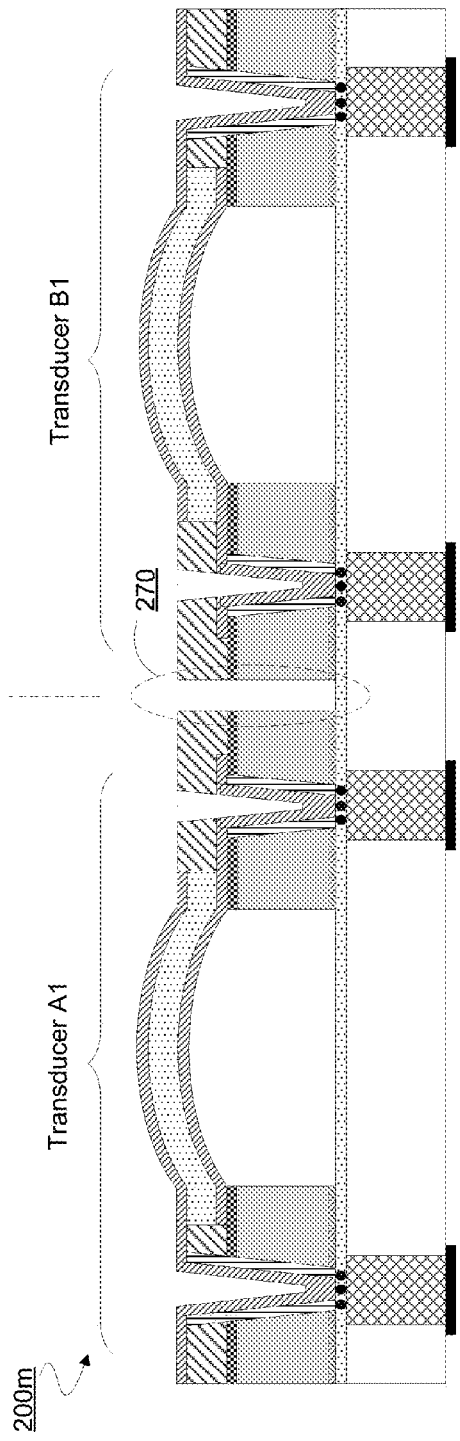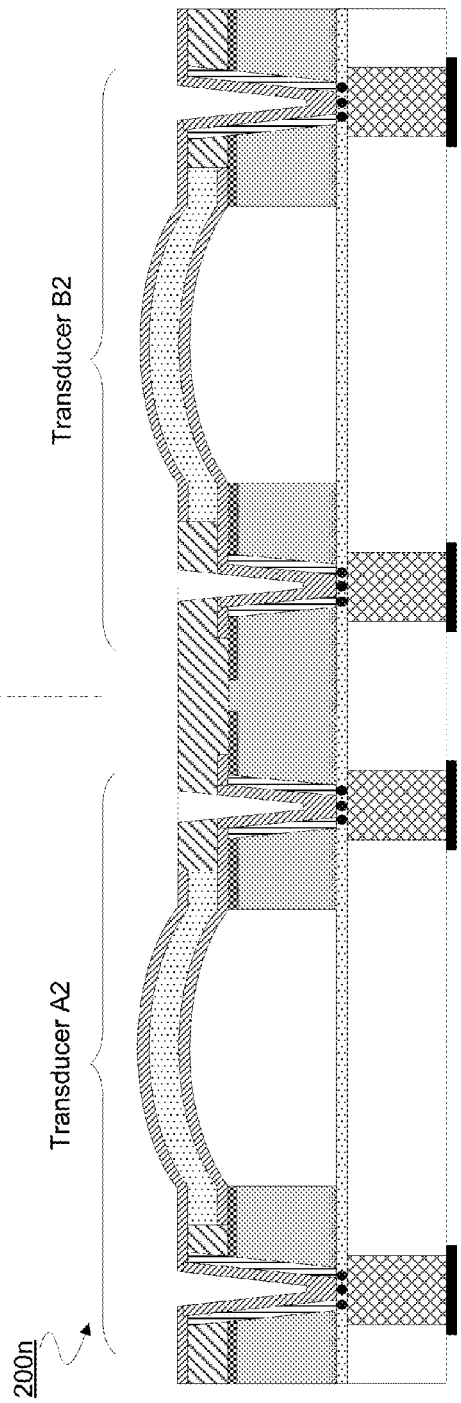

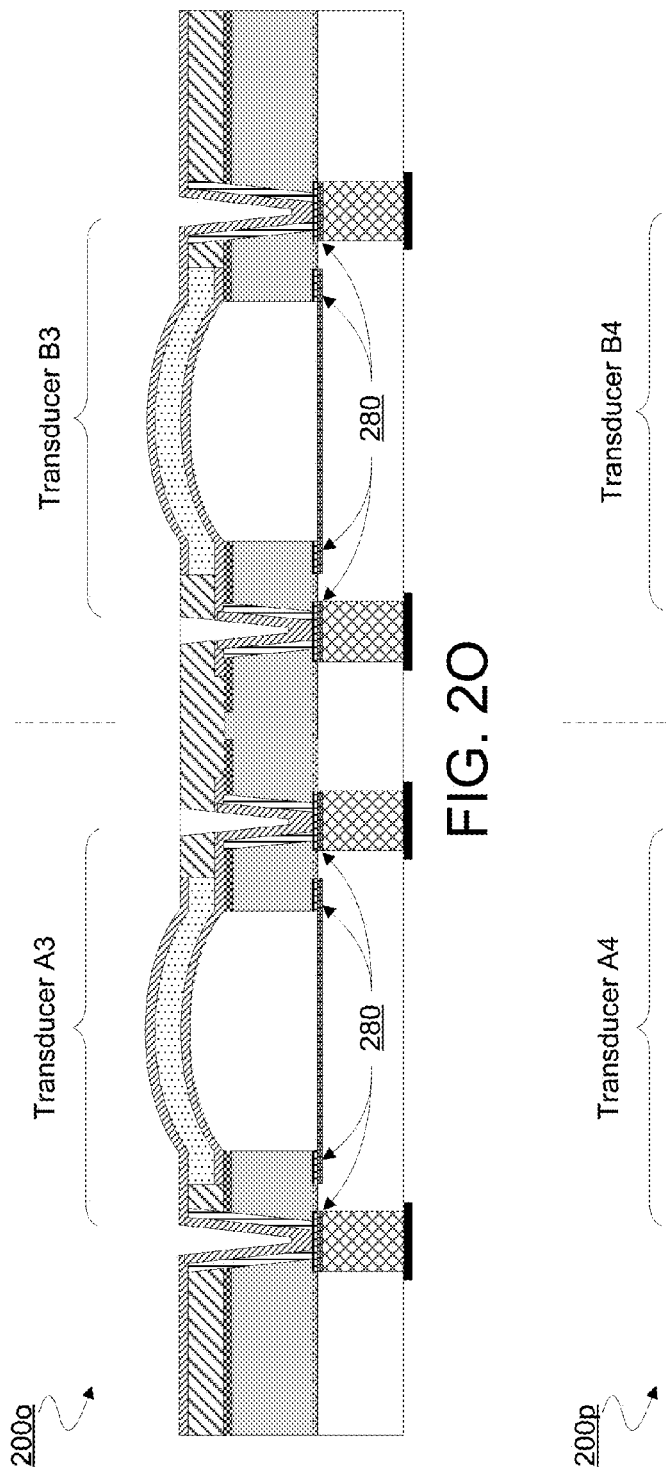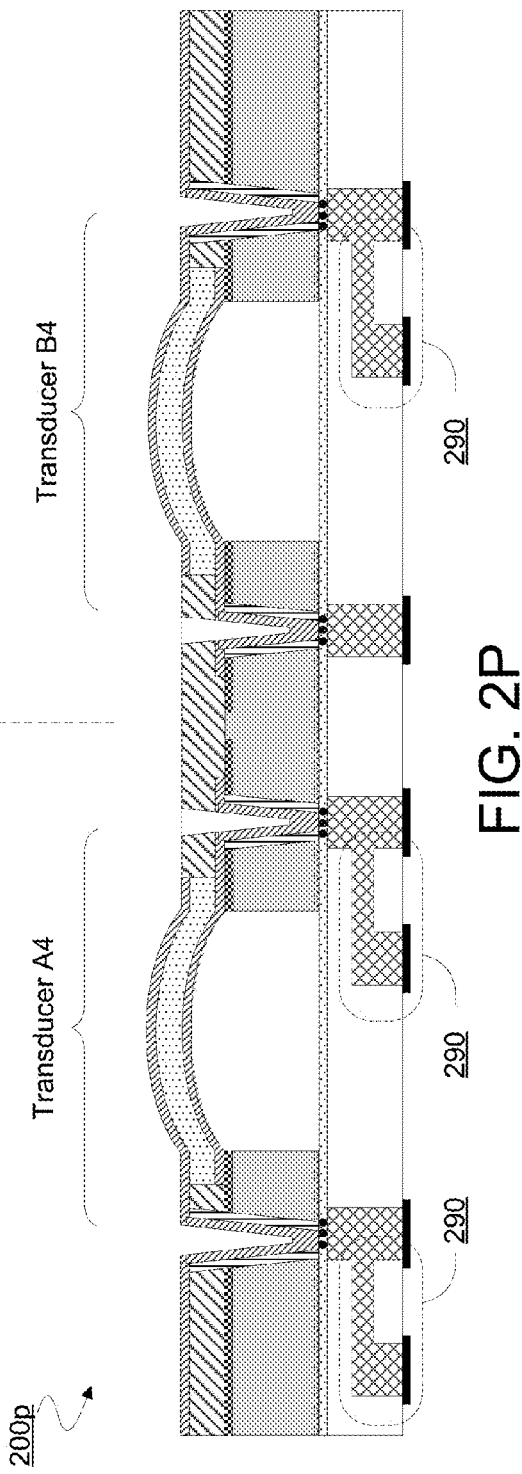

FLEXIBLE MICROMACHINED TRANSDUCER DEVICE AND METHOD FOR FABRICATING SAME

BACKGROUND

1. Technical Field

Embodiments of the invention generally relate to micromachined transducer arrays, and more specifically pertain to structures for providing flexibility of such arrays.

2. Background Art

Transducer devices typically include a membrane capable of vibrating in response to a time-varying driving voltage to generate a high frequency pressure wave in a propagation medium (e.g., air, water, or body tissue) in contact with an exposed outer surface of a transducer element. This high frequency pressure wave can propagate into other media. The same piezoelectric membrane can also receive reflected pressure waves from the propagation media and convert the received pressure waves into electrical signals. The electrical signals can be processed in conjunction with the driving voltage signals to obtain information on variations of density or elastic modulus in the propagation media.

Transducer devices can be advantageously fabricated inexpensively to exceedingly high dimensional tolerances using various micromachining techniques (e.g., material deposition, lithographic patterning, feature formation by etching, etc.). Such arrayed devices include micromachined ultrasonic transducer (MUT) arrays such as capacitive transducers (cMUTs) or piezoelectric transducers (pMUTs), for example.

Many ultrasound applications—such as intravascular ultrasound (IVUS), endoscopic ultrasound (EUS) or other medical sonography techniques—use catheters or other such instruments having non-planar surfaces. Typically, transducer arrays are positioned to avoid, or sized to accommodate, a somewhat small radii of curvature (e.g. ~5-10 mm) of such non-planar surfaces. However, as successive generations of such instruments continue to scale in size, there is an attendant push for transducer arrays to support operation on surfaces having smaller radii of curvature.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously allow for flexibility of an array of piezoelectric transducer elements. For example, techniques and structures discussed herein variously provide a transducer array comprising microelectromechanical system (MEMS) structures, where the transducer array may be flexed to have a radius of curvature as small as, or even less than, 1 mm.

Certain techniques and structures discussed herein additionally or alternatively enable electrical interconnects and/or routing which are suited for applications wherein a transducer array is to operate on a curved surface of a small sensor device. For example, certain embodiments variously provide for a reference voltage (e.g. ground) and/or drive/sense signaling to be communicated through a "back" side of the transducer array—i.e. where piezoelectric membrane structures of the array are configured to transmit/receive ultrasonic (or other) signals via an opposite "front" side of the transducer array. By contrast, existing planar (non-flexible) sensors have interconnect contacts on their respective front sides.

In some embodiment, piezoelectric membrane structures and interconnect/signaling structures of the transducer array are integrated together in a layered structure which includes a flexible layer of polymer material. Interconnects for the transducer elements may extend through such a flexible layer to allow for the exchange of a reference voltage, drive/sense signals and/or the like. For example, transducer elements may variously exchange such voltages/signals via the flexible layer with another underlying flexible layer, with an application specific integrated circuit (ASIC) and/or the like.

In certain embodiments, transducer array structure may at some point be formed on and/or coupled to a wafer so that they may be processed at a wafer level (e.g. rather than at a die level or other smaller level). Subsequent processing may include cutting transducer array structures into one or more individual transducer arrays for respective die-level applications. For example, such cutting may form one or more 1 D (e.g. including a 1×n array of transducer elements, for some integer n>1) transducer arrays and/or one or more 2D transducer arrays (e.g. including a m×n array of transducer elements, where integers m, n>1).

Figure 1A:
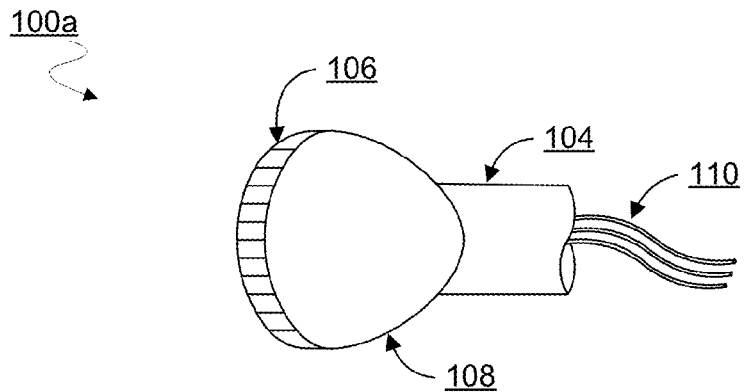
FIGS. 1A through 1D illustrate example configurations of devices that each include a flexible transducer array according to a respective embodiment.

FIGS. 1A-1D illustrate example configurations of devices that include flexible arrays of piezoelectric transducer elements. In some implementations, a transducer device includes a curved transducer array comprising a single row of transducer elements. Some or all of a plurality of elements of the transducer array may be distributed along a curved line. As shown in FIG. 1A, a transducer device 100a may include a handle portion 104. A transducer array 106 of device 100a may be attached to handle portion 104 at one distal end 108 where the shape of the handle 104 is modified (e.g., widened, flattened, etc.) to accommodate the shape and size of the transducer array 106. In this example, a vibrating surface of the transducer array 106 is along an arc, part of which faces in along a long axis of the handle 104. In other implementations, the exposed surface of the transducer array 106 may instead be along an arc, a part of which faces in a direction perpendicular (or at an acute angle) to the long axis of the handle 104. An operator of the transducer device 100a may manipulate the handle 104 to change the direction and location of the vibrating surface of the transducer array 106 as desired (e.g., facing the area(s) to be imaged).

The piezoelectric transducer device 100a may optionally include an integrated ASIC wafer (not shown) below the array of vibrating elements 106 and inside the handle portion 104 (e.g., inside the widened and flattened first distal end 108). Wires 110 connecting to the external input connections of the ASIC wafer may exit from the back end of the handle 104 and be connected to external equipment (e.g., a control device and/or a display device).

In some implementations, transducer devices may include two dimensional transducer arrays. Each two-dimensional transducer array may include multiple transducer elements distributed in a curved two-dimensional array. The area covered by the two-dimensional array may be of various shapes, e.g., rectangular, square, circular, octagonal, hexagonal, circular, and so on. The vibrating elements in the two-dimensional array may be distributed on a lattice consisting of lines (e.g., a square lattice or hexagonal lattice) or of more complex patterns. The vibrating surface of the two-dimensional transducer array may be substantially within a plane, although certain embodiments are not limited in this regard. The two-dimensional transducer array may be attached to a handle (e.g., at one distal end of a straight cylindrical handle) to form the transducer device. A plane of a vibrating surface of the transducer array may include one or more portions which variously face directions which are perpendicular to a long axis of the handle or variously face directions which are substantially parallel to the long axis of the handle.

Figure 1B:
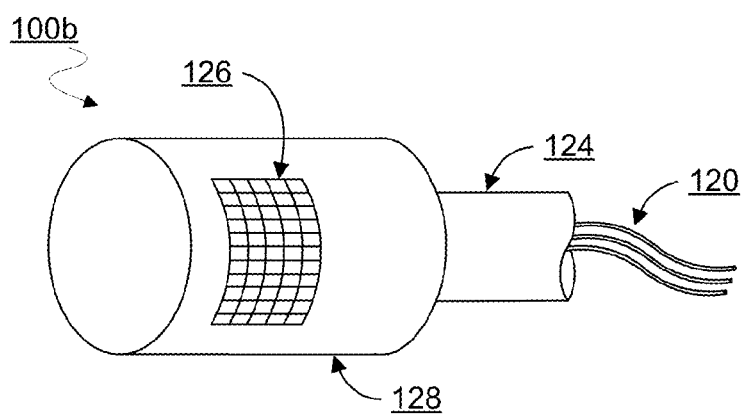

An operator of the transducer device may manipulate the handle of a transducer device to change the facing direction and location of the vibrating surface of a two-dimensional transducer array as desired (e.g., facing the area(s) to be imaged). For example, as shown in FIG. 1B, a transducer device 100b includes a side-facing transducer array 126 that runs along a circumference of a distal end 128 of the handle 124. The transducer device 100b also includes wires 120 connected to an ASIC wafer (not shown) and exiting a back end of the handle 124.

Figure 1C:
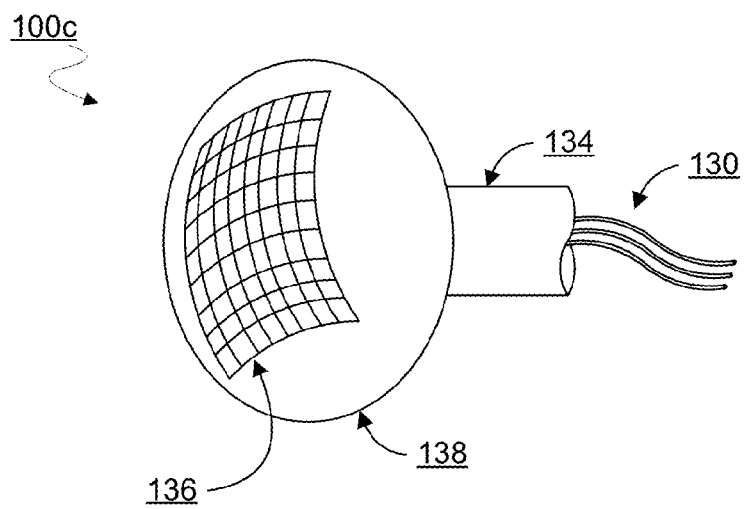

Referring now to FIG. 1C, a transducer device 100c according to another embodiment includes a forward-facing two-dimensional transducer array 136. The transducer device 100c may comprise a handle portion 134, where transducer array 136 extends along a curved surface of a distal end 138 of handle 134. As shown in FIG. 1C, transducer array 136 may curve in multiple directions along the surface of distal end 138. The transducer device 100c may further comprise wires 170 connected to an ASIC wafer (not shown) and exiting a back end of the handle 134.

The configurations of the transducer devices shown in FIGS. 1A-1C are merely illustrative. Different combinations of the facing direction (e.g., forward-facing, side-facing, or other facing angles) and overall shape (e.g., flat or curved, linear, polygonal, or annular) of the vibrating surface of entire transducer array, the positions of the transducer array on the handle, and the layout of the vibrating elements on the transducer array are possible in various implementations of the transducer devices.

Figure 1D:
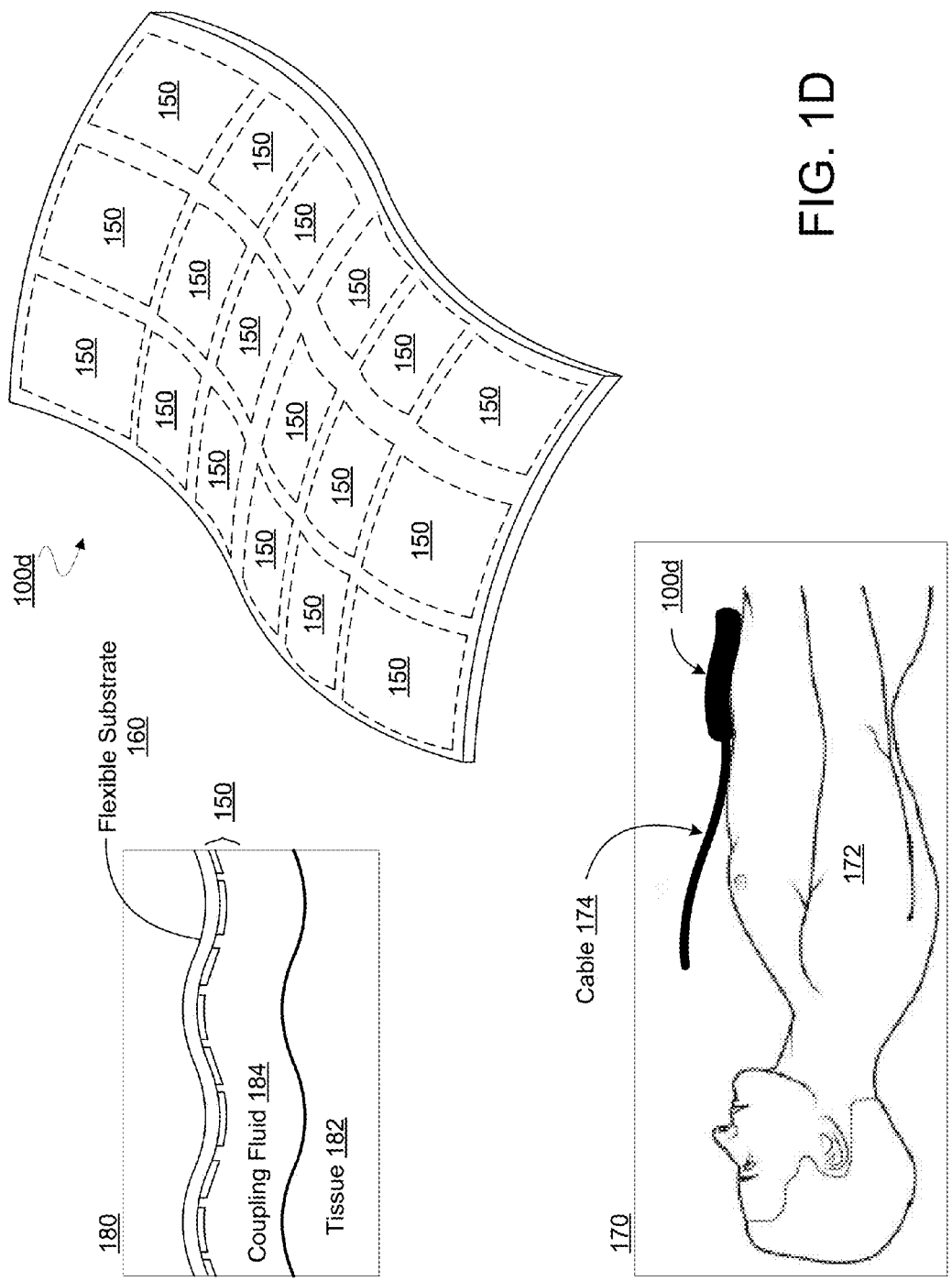

Referring now to FIG. 1D, a transducer device 100d according to another embodiment includes an array of transducer elements 150 disposed on a flexible substrate 160. As shown in view 170 and detail view 180 (not to scale) of FIG. 1D, flexible substrate 160 may allow for transducer elements 150 to be readily repositioned relative to one another. Accordingly, transducer device 100d may serve as at least part of a bandage, patch, sheet or other flexible structure which may be laid on, worn by or otherwise applied to some user—e.g. the illustrative patient 172. For example, transducer elements 150 may conform to the surface of tissue 182 of patient 172 and propagate pressure waves into (and/or receive pressure waves from) tissue 182—e.g. via coupling fluid 184 (e.g. a gel). In an embodiment, a cable 174 included in or coupled to transducer device 100d comprises one or more wires which, for example, connect to external input connections of an ASIC wafer and/or connect to other external equipment (e.g., a control device and/or a display device).

In addition, depending on the applications (e.g., the desired operating frequencies, imaged area, imaging resolutions, etc.), the total number of vibrating elements in the transducer array, the size of the transducer array, and the size and pitch of the vibrating elements in the transducer array may also vary. In a given array, the respective piezoelectric membranes of transducer elements may each include a respective semi-spherical or semi-ellipsoidal dome structures. A piezoelectric membrane may span a cavity having a cross-sectional width ranging for example, from 25 µm to 250 µm. In some embodiments, an array may include transducer elements which are all arranged with respect to one another along a first dimension. For example, a single dimension (1 D) array may include 128 transducer elements arranged to have a pitch of 150 µm, where each transducer element has a semi-spherical dome spanning a cavity having a 60 µm width. In another example, a 1 D array includes 128 transducer elements having a pitch of 350 µm, each element having a semi-spherical dome which spans a cavity having a width between 64 µm to 92 µm. In still another example, a 1D phased array may include 96 transducer elements arranged to have a pitch of 130 µm, wherein semi-ellipsoidal domes of the array all have the same first principal axis diameter along a first dimension and a similar second principal axis diameter along a second dimension—e.g. the principal axis diameters in a range from 40 µm to 100 µm. Alternatively or in addition, an array may include sets of transducer elements variously arranged along two dimensions. In one illustrative embodiment, a two dimension (2D) array may include 64×16 transducer elements with area pitch of 120 µm—e.g. where dome structures of the array each span a respective cavity having a width between 60 µm and 70 µm.

Figure 2A:
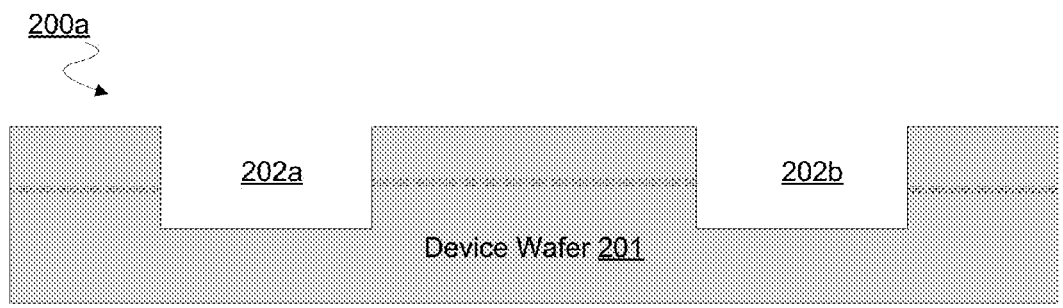
FIGS. 2A through 2P are cross-sectional views which each illustrate elements of a stage of a process for fabricating a flexible transducer array according to a respective embodiment.

FIGS. 2A-2M show cross-sectional views for various stages of a process to fabricate a flexible transducer array according to an embodiment. FIGS. 2N-2P show respective cross-sectional views each for a flexible transducer array according to an embodiment. The processing shown in FIGS. 2A-2J may form one or more of transducer arrays 106, 126, 136, for example.

FIG. 2A illustrates a stage 200a of fabrication during which a device wafer 201 is prepared for subsequent processing to form in or on device wafer 201 various structures of respective transducer elements. Device wafer 201 may include any of various substrate materials known in the art as amenable to microelectronic/micromachining processing. By way of illustration and not limitation, device wafer 201 may include a bulk crystalline semiconductor such as silicon, and/or materials of various types of semiconductor wafers. Although certain embodiments are not limited in this regard, the illustrative device wafer 201 includes a silicon on insulator (SOI) material.

Certain embodiments are discussed herein with respect to the fabrication of microdome-type transducer elements which each include convex piezoelectric structures disposed on a support layer. However, such discussion may be extended to additionally or alternatively apply to any of various other types of transducer elements—e.g. including transducer elements which instead include flat piezoelectric structures and/or concave piezoelectric structures. For example, as shown in FIG. 2A, fabrication of piezoelectric transducer elements in and/or on device wafer 201 may include etching or otherwise forming one or more holes— e.g. including the illustrative holes 202a, 202b which, for example, extend to or through an insulator layer in device wafer 201.

Figure 2B:
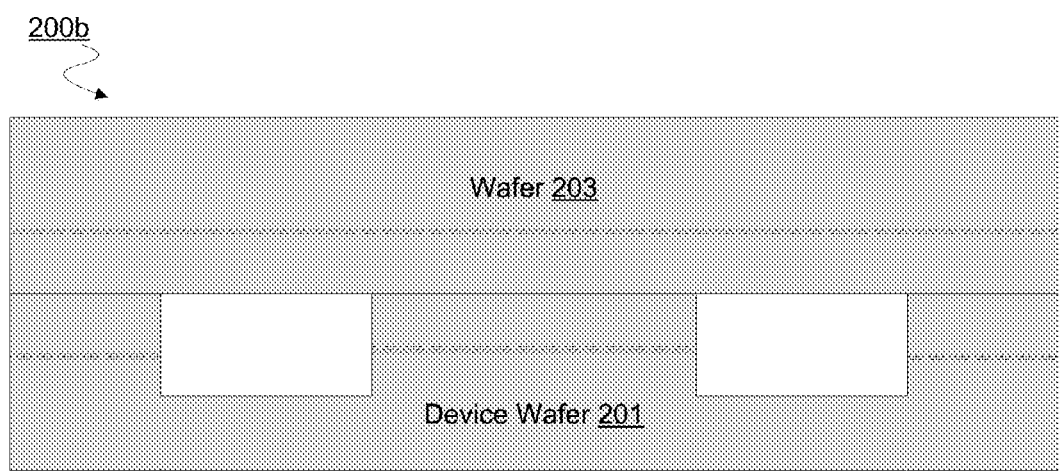

Referring now to FIG. 2B, another wafer 203 may be bonded to device wafer 201 at stage 200b. Wafer 203 may provide material to facilitate the formation of convex structures of transducer elements. For example, wafer 203 may include a semiconductor material such as that of device wafer 201—e.g. where wafer 203 includes a silicon on insulator (SOI) material.

Figure 2C:
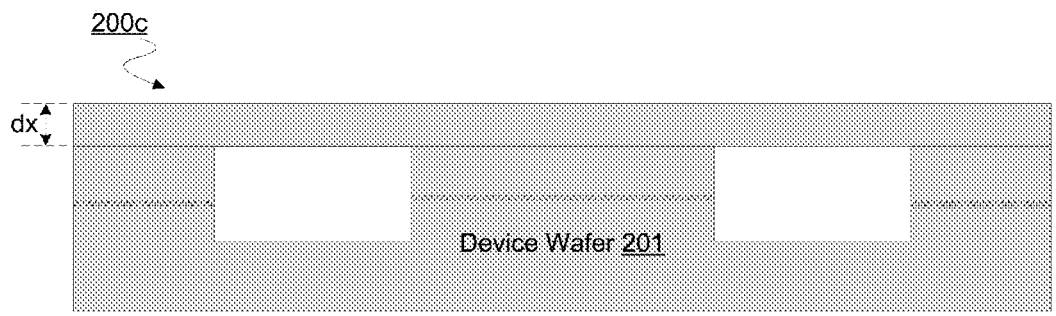

As shown in stage 200c of FIG. 2C, grinding, etching (e.g. with KOH), polishing and/or other processing may result in thinning of wafer 203 to a thickness dx which facilitates the formation of bump structures on wafer 201. For example dx may be between 6 microns and 12 microns, although certain embodiments are not limited in this regard.

Figure 2D:
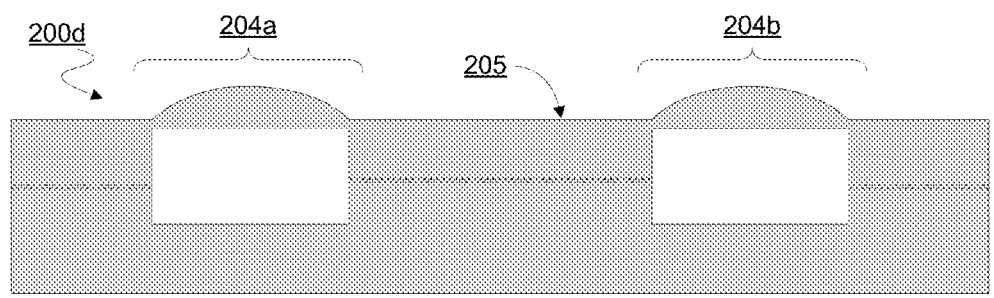
Figure 2E:
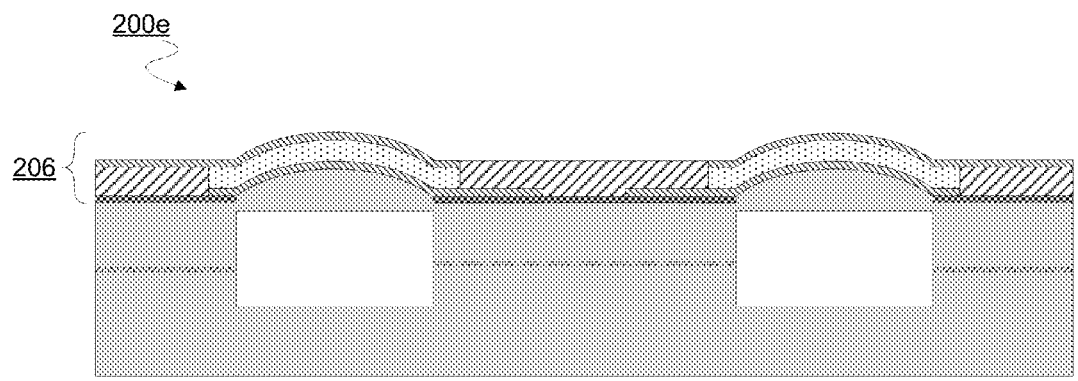

Referring now to stage 200d of FIG. 2D, remaining material of wafer 203 may be formed into microbumps—e.g. including the illustrative bump structures 204a, 204b—which extend above a surface 205. Formation of such microbumps may include selectively removing portions of the thinned wafer 203—e.g. with operations adapted from conventional lithography and etch techniques—and applying a bump reflow processing to other remaining portions of wafer 203.

Subsequent to the formation of such microbumps, any of a variety of subtractive and/or additive semiconductor processing techniques (e.g., including one or more of material deposition, lithographic patterning, feature formation by etching, etc.) may be performed to deposit or otherwise form transducer structures in or on device wafer 201. For example, as shown in stage 200e of FIG. 2E, structures 206 may be variously formed on surface 205, where bump structures 204a, 204b facilitate the formation of convex portions of structures 206.

Figure 2F:
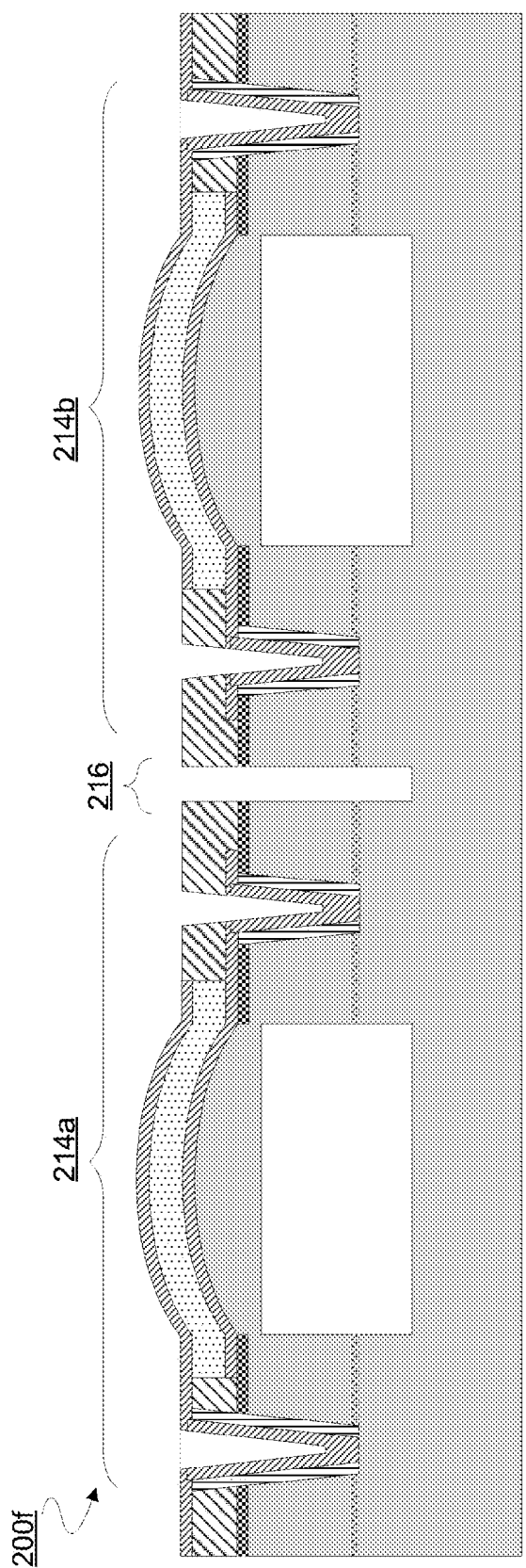

An example of some transducer elements which may result from such processing is illustrated in stage 200f of FIG. 2F. More particularly, a plurality of transducer elements formed by stage 200f may include transducer element 214a and transducer element 214b. Although certain embodiments are not limited in this regard, one or more other structures may be etched or otherwise formed between transducer elements—e.g. to facilitate a subsequent bending point between transducer elements 214a, 214b. For example, stage 200f includes a cavity 216 which is etched in device wafer 201 (and, in an embodiment, through one or more structures formed on device wafer 201).

FIG. 2G illustrates a detail view 200g of a transducer element such as one of those fabricated in the processing for stage 200f. As depicted in view 200g, a bottom electrode 236 may be disposed on a thin film dielectric layer 246, such as silicon dioxide, that can serve as a support, etch stop during fabrication, electrical insulator, and/or diffusion barrier. Dielectric layer 246 may be disposed by thermal oxidation, for example. In an embodiment, portions of dielectric layer 246 under piezoelectric element 232 are subsequently etched away, in addition to portions of device wafer 201, during etch processing to form a cavity 230. A piezoelectric element 232 may be subsequently formed on bottom electrode 236.

In the illustrative embodiment, piezoelectric element 232 includes Lead Zirconate Titanate (PZT), although any piezoelectric material known in the art to be amenable to conventional micromachine processing may also be utilized, such as, but not limited to polyvinylidene difluoride (PVDF) polymer particles, BaTiO3, single crystal PMN-PT, and aluminum nitride (AlN). Bottom electrode 236 may comprise a thin film layer of conductive material that is compatible (e.g., thermally stable, has good adhesion, low stress) with the piezoelectric membrane material, such as, but not limited to, one or more of Au, Pt, Ni, Ir, Sn, etc., alloys thereof (e.g., AuSn, IrTiW, AuTiW, AuNi, etc.), oxides thereof (e.g., IrO2, NiO2, PtO2, indium tin oxide (ITO), etc.), or composite stacks of two or more such materials.

A second dielectric layer 224 (including SiNx or SiOx, for example) may be disposed —e.g. via plasma-enhanced chemical vapor deposition (PECVD)—over portions of bottom electrode 236 and/or piezoelectric element 232. Dielectric layer 224 may provide for electrical isolation of bottom electrode 236 and a top electrode 234 to be disposed over dielectric layer 224. As shown, the top electrode 234 may be disposed in direct contact with a top surface of second dielectric layer 224. In this illustrative embodiment, the top electrode 234 is employed as the reference (ground) plane to shield the transducer element from electro-magnetic interference and the surface electrical charge in the ambient environment during operation. As such, the bottom electrode 236 may be employed for coupling to a drive/sense signal terminal for the piezoelectric transducer element. Bottom electrode 236 and/or top electrode 234 may be disposed, for example, by physical vapor deposition (PVD), atomic layer deposition (ALD), chemical vapor deposition (CVD) or the like.

In an embodiment, etch, mask and/or other processing may provide for various cavities to extend through portions of the transducer element. Such processing may form one or more cavities for positioning interconnect structures, for example. The interconnect structures may include a reference interconnect 228 which is to provide a reference voltage (e.g. ground), and another interconnect 238—for brevity, referred to herein simply as a drive/sense (or for brevity, simply drive) interconnect—which is to provide a drive signal and/or a sense signal. As used herein "drive signal" refers to a signal which is to activate a piezoelectric element of a transducer device, and a "sense signal" refers to a signal generated in response to activation of such a piezoelectric element. A drive/sense interconnect may alternatively be referred to as a signal interconnect or an active interconnect, for example.

In the detail view 200g, respective cavities for reference interconnect 228 and drive/sense interconnect 238 each extend from a top surface 226 of the transducer element through to device wafer 201. Interconnects 228, 238 may be variously built, for example, of plated copper, and electrically connect to top electrode 234 and bottom electrode 236, respectively. The width of the openings of such cavities may be ~6 or 7 microns, although certain embodiments are not limited in this regard. Interconnects 228, 238 may comprise respective thin film layers of conductive material (e.g., deposited by PVD, ALD, CVD, etc.) of any conventional composition capable of providing a low resistance and amenable to patterning, such as, but not limited to, Au, Al, W, or Cu. In some embodiments, interconnects 228, 238 may be electrically isolated from semiconductor material of the device wafer 201 and/or one or more structures of the transducer element by an isolation material 220 such as Al2O3—e.g. where isolation material 220 is deposited by ALD.

In an embodiment, another cavity 230 may be etched or otherwise formed under the transducer element 232. Cavity 230 may subsequently provide a spanning void to allow for vibration of the transducer element 232. Cavity 230 may be defined at least in part by sidewalls 218 of device wafer 201 which are opposite one another. The cavity 230 may have a width (e.g. a diameter, where transducer element 232 is circular) of ~100 microns (e.g. 90-110 microns), although certain embodiments are not limited in this regard. As discussed herein, a transducer element may further comprise or adjoin one or more flexural structures which allow for flexibility of a transducer array.

Figure 2H:
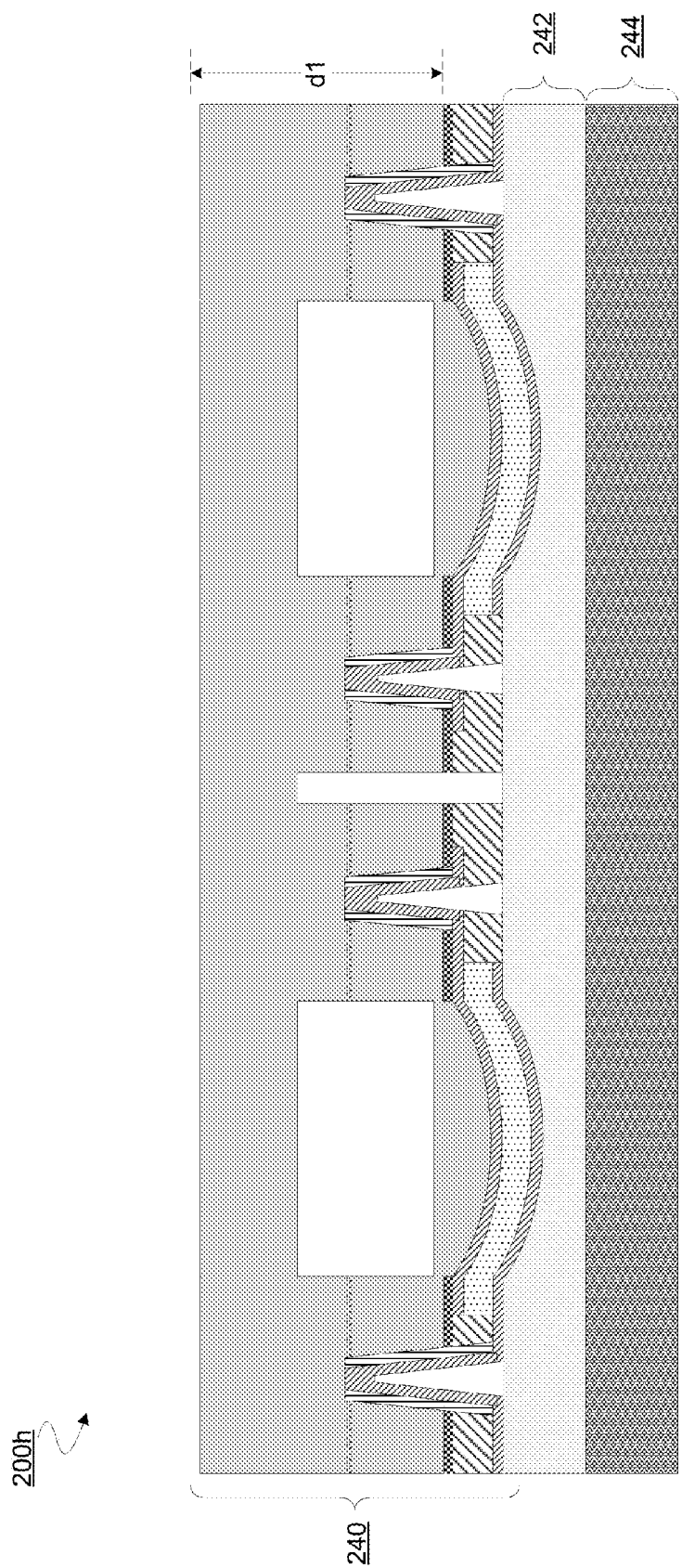

Referring now to FIG. 2H, a stage 200h of the fabrication process is shown wherein a sub-assembly 240 is bonded to a sacrificial wafer 244 via a temporary bonding material 242 such as any of polyimide (HD-3007 by Hitachi Chemical DuPont Microsystems), WaferBOND HT-series by Brewer Science, photoresist and SU-8. Sub-assembly 240 may include transducer elements formed in a device wafer—e.g. as shown in stage 200f. Sacrificial wafer 244 may provide for mechanical support for handling and/or subsequent processing of sub-assembly 240. For example, sacrificial layer 244 may protect the transducer elements during inversion of sub-assembly 240 and/or thinning of the device wafer.

By way of illustration and not limitation, the device safer of sub-assembly 240 may be thinned from a total thickness d1 shown in stage 200h to a comparatively small total thickness d2 of a resulting modified sub-assembly 241, as shown in stage 200i of FIG. 2I. Such thinning may be performed using mechanical grinding, dry chemical etching (DCE) and/or any of various other methods adapted from conventional wafer thinning techniques. The total thickness d2 may be equal to or less than 100 microns (for example) and, in particular embodiments, may be equal to or less than 30 microns.

The material of the device wafer in sub-assembly 240 may serve as a support layer providing mechanical support for transducer elements therein/thereon. Thinning the support layer to the total thickness d2 may allow for flexing in and/or between transducer elements, while the support layer provides mechanical support for transducer elements during such flexing.

For example, thinning of the support layer to form sub-assembly 241 may expose a side 284 of the support layer. Exposure of side 284 may also expose one or more openings to respective cavities formed in the support layer. By way of illustration and not limitation, the thinning of the support layer may expose openings 280a, 280b each to a respective spanning void for a respective transducer element. Additionally or alternatively, such thinning may expose an opening 282 to a channel which is to serve as a flexural structure, as discussed herein.

In an embodiment, the thinning of the support layer may additionally or alternatively expose one or more interconnects of the transducer elements. For example, the exposed side 284 may include exposed portions for various reference interconnects and/or drive/sense interconnects for respective transducer elements. As discussed herein, additional processing may variously couple some or all of such exposed interconnects each to a corresponding interconnect of a flexible polymer layer.

Referring now to stage 200j of FIG. 2J, additional etching or other subtractive processing may be performed through the exposed openings 280a, 280b to remove that remaining material of wafer 203 which facilitated the formation of concave structures of the transducer elements. In an embodiment, such subtractive processing exposes an underside of the bottom electrode 236 of a transducer element.

Figure 2K:
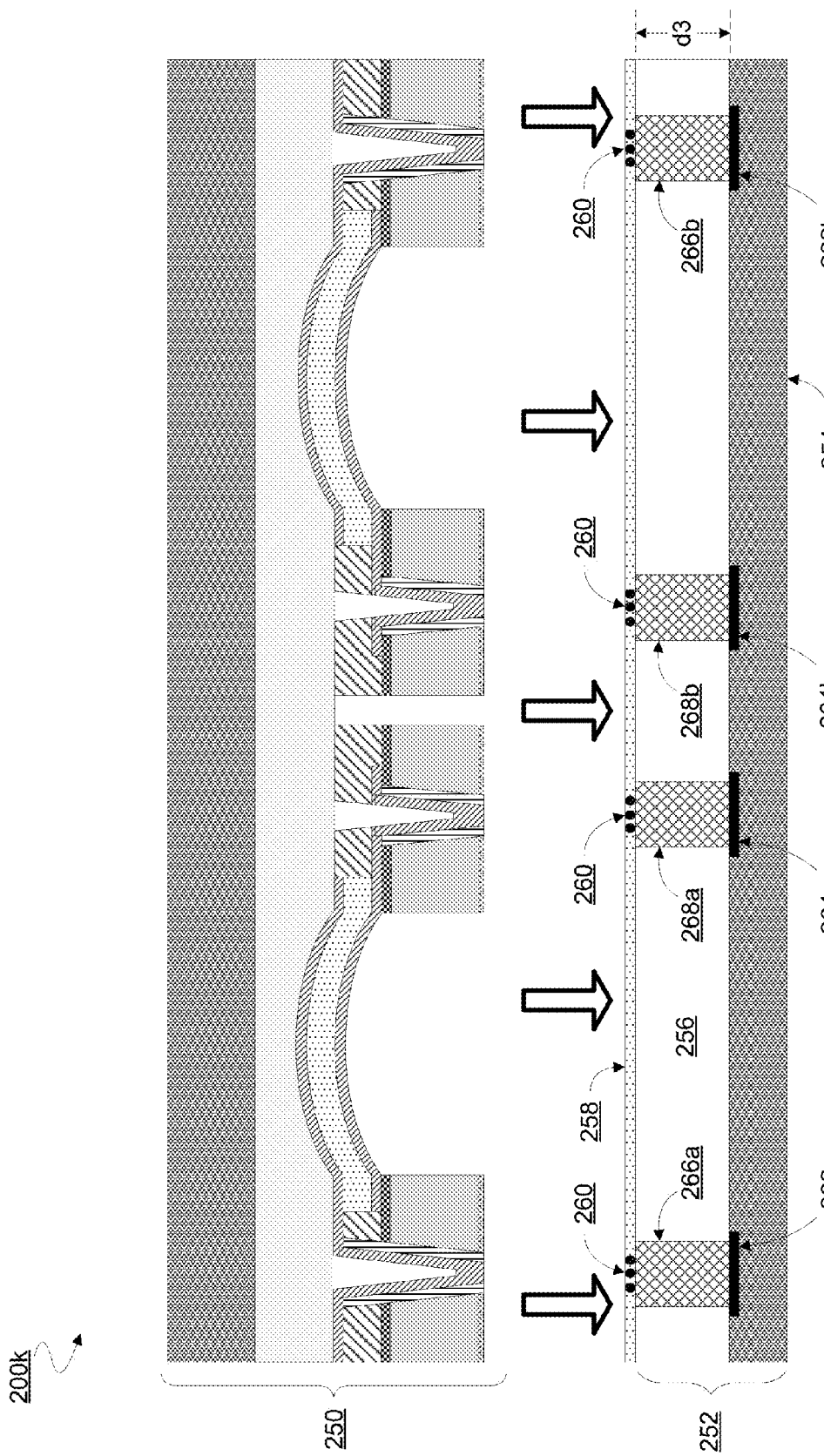

Referring now to FIG. 2K, a processing stage 200k is shown wherein a sub-assembly 250 including the structures shown in stage 200i is to be adhered or otherwise bonded to a sub-assembly 252. For example, the side 284 of the support layer of sub-assembly 241 may be bonded to sub-assembly 252 via an adhesive 258 which includes conductive fillers 260. The conductive fillers 260, which may be distributed throughout adhesive material 258, may provide a conductive path between a pair of interconnects which are aligned with one another, and adhered by adhesive material 258. However, the adhesive material between fillers 260 may electrically isolate different pairs of such aligned interconnects from one another. In one illustrative embodiment, the adhesive material 258 comprises benzocyclobuten (BCB) and metal (and/or metal coated) spheres. Alternatively, a polyimide material such as HD-7000 by DuPont may be used instead of BCB for adhesive material 258.

Sub-assembly 252 may include a flexible supporting structure and various electrical connection structures for the transducer elements. In an embodiment, sub-assembly 252 is fabricated on a separate wafer prior to adhesion to sub-assembly 250—e.g. where some or all of the electrical connection structures are formed variously formed in or on the flexible supportive carrier by subtractive and/or additive processing. By way of illustration and not limitation, sub-assembly 250 may include structures bonded to or otherwise formed on a sacrificial layer 254 which is to provide mechanical support for other structures sub-assembly 250 during subsequent processing such as the bonding during stage 200k.

In an embodiment, the flexible supporting structure provided by sub-assembly 252 includes a polymer layer 256 comprising a cured polymer material such as polyimide. Examples of other suitable polymer materials for polymer layer 256 include polyester (PET), polyethylene napthalate (PEN), Polyetherimide (PEI), along with various fluropolymers (FEP) and copolymers Polyimide films. Polymer layer 256 may be coated as a single layer or multiple layers of polymer material(s).

Electrical connection structures of sub-assembly 252 may comprise one or more interconnects each corresponding to a respective interconnect in the support layer of sub-assembly 250. For example, sub-assembly 252 may include interconnects which each extend through the polymer material of layer 256. Various subtractive and/or additive semiconductor processing techniques (e.g., including one or more of material deposition, lithographic patterning, feature formation by etching, etc.) may be adapted, according to various embodiments, to variously form such interconnect structures in the polymer material. By way of illustration and not limitation, such interconnects may comprise ground interconnects 266a, 266b each to couple to a corresponding ground interconnect of a respective transducer element of sub-assembly 250. In an embodiment, sub-assembly 252 further comprises ground contacts 262a 262b which are plated or otherwise disposed on a surface of polymer layer 256. Ground interconnects 266a, 266b may variously provide for electrical connectivity between ground contacts 262a 262b, respectively, and the transducer elements of sub-assembly 250.

Alternatively or in addition, such interconnects may comprise drive/sense interconnects 268a, 268b each to couple to a corresponding drive/sense interconnect of a respective transducer element of sub-assembly 250. Sub-assembly 252 may comprise drive/sense contacts 264a, 264b which are plated or otherwise disposed on polymer layer 256—e.g. where drive/sense interconnects 268a, 268b variously provide electrical connectivity between drive/sense contacts 264a 264b, respectively, and transducer elements of sub-assembly 250.

Figure 2L:
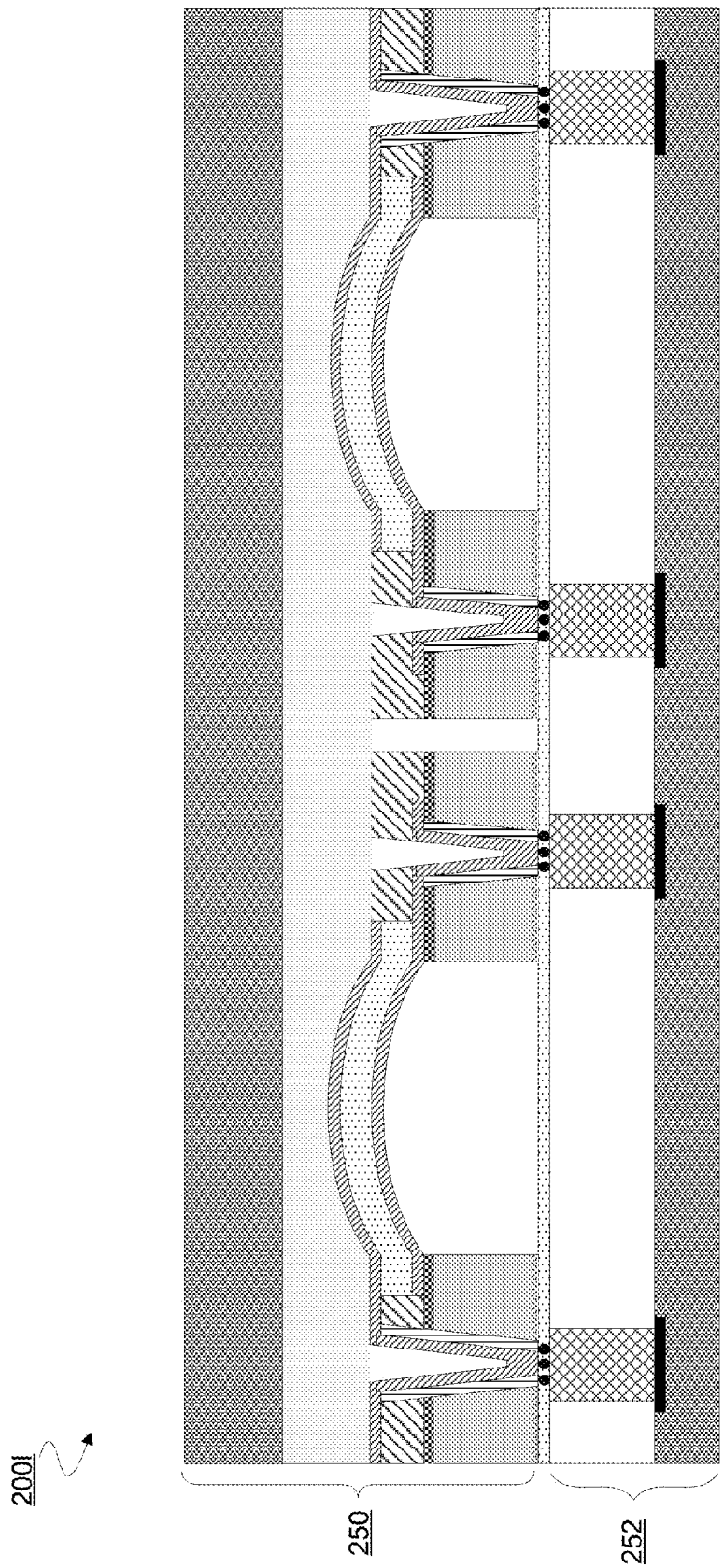

Referring now to FIG. 2L, a stage 200l of processing is shown wherein sub-assemblies 250, 252 are bonded together. After stage 200l, subsequent processing may be performed to remove the sacrificial layer 244 of sub-assembly 250 and/or the sacrificial layer 254 of sub-assembly 252. A resulting assembly for a processing stage 200m is shown in FIG. 2M. In stage 200m, a transducer array includes transducers A1, B1, where a flexural structure 270 provides flexibility between transducers A1, B1. Such flexibility may be additionally or alternatively facilitated the total thickness d2 of the support layer for the transducers A1, B2 and/or by the polymer layer underlying transducers A1, B2. For example, FIG. 2N show a stage 200n for a fabrication process according to an alternative embodiment. In stage 200n, a similar transducer array including transducers A2, B2 is formed, wherein no structure such as flexural structure 270 is located between transducers A2, B2. Flexibility of the transducer array of FIG. 2N may result at least in part from a sufficiently thin (e.g. less than or equal to 30 microns) support layer for transducers A2, B2 and a flexible polymer layer underlying the support layer.

In another embodiment, adhesion between sub-assembly 250 and sub-assembly 252 may be achieved by low temperature eutectic bonding, such as that achieved with Au and AuSn. By way of illustration and not limitation, an Au layer may be deposited on portions of sub-assembly 250 which are to bond to sub-assembly 252, and an AuSn layer may be deposited on portions of sub-assembly 252. Prior to eutectic bonding, one or both such layers may be patterned using photolithography and etching to form desirable bonding surfaces for transducers A3, B3—e.g. where resulting bonding points 280 are variously patterned to seal off openings, provide respective conductive paths for interconnects and/or otherwise provide strong mechanical bonding.

In certain embodiments, sub-assembly 250 and sub-assembly 252 are bonded together using a non-conductive paste (NCP) such as one including BCB or polyimide as a bonding material. Galvanic contacts between metal interconnects on sub-assembly 250 and respective metal contacts on sub-assembly 252 may be achieved at least in part by conductive structures of sub-assembly 252—such as interconnects 266a, 266b, 268a, 268b—being etched or otherwise formed to variously extend from such metal contacts and form protrusions which extend above polymer layer 256 at a height that is at least equal to the adhesion bond-line thickness.

In certain embodiments, the flexible layer of a transducer array includes one or more layers of electrical distribution structures which, for example, provide for operation of and/or signal communication with transducer elements. For example, FIG. 2P show a stage 200p of a fabrication process which, for example, includes some or all of the features of the process illustrated in FIGS. 2A-2M. In stage 200p, a transducer array including transducers A4, B4 is similarly formed, wherein a flexible layer for transducers A4, B4 includes conductive portions 290 which variously extend from interconnect structures such ground interconnects 266a, 266b and/or drive/sense interconnects 268a, 268b. In an embodiment, such conductive portions 290 variously extend laterally within the flexible layer, and additionally or alternatively couple to respective contacts on an underside of the flexible layer, to variously distribute power, ground and/or signaling to, from and/or among transducers.

Figure 3:
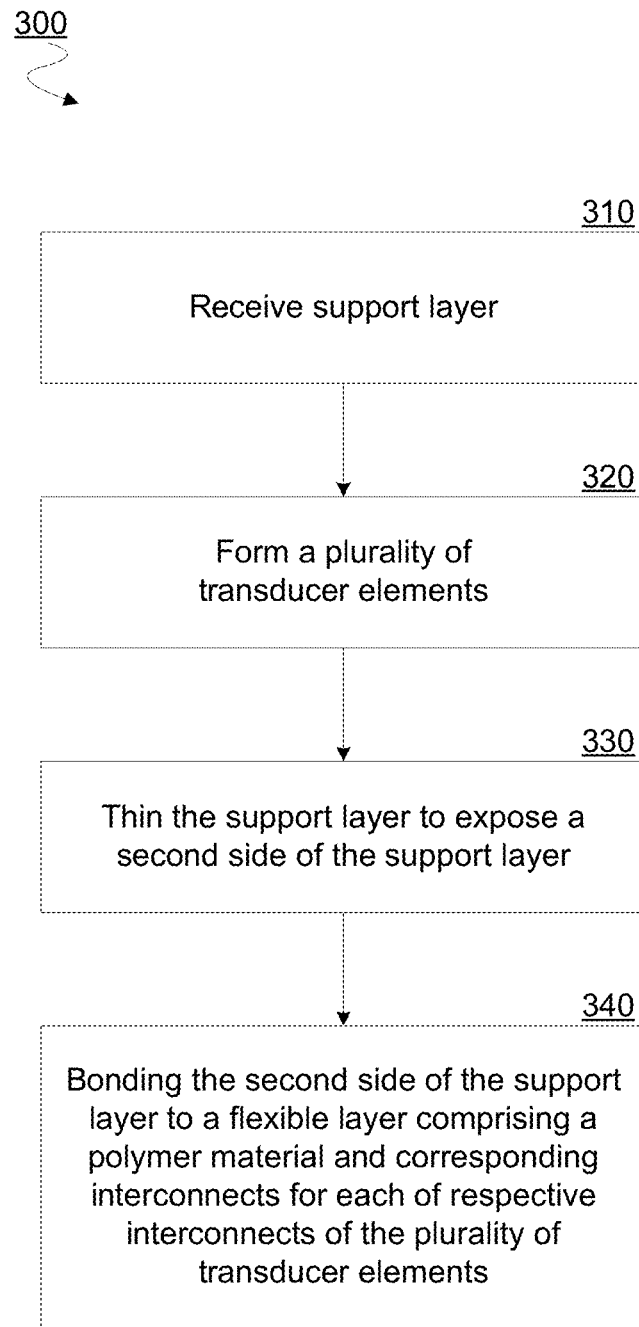
FIG. 3 is a flow diagram illustrating elements of a method to fabricate a flexible transducer array according to an embodiment.

FIG. 3 illustrates elements of a method 300 for fabricating a flexible transducer array according to an embodiment. Method 300 may include micromachining and/or other fabrication operations to variously form, for example, some or all of the structures shown in FIGS. 2A-2J.

In an embodiment, method 300 includes, at 310, receiving a support layer such as device wafer 210. Method 300 may further comprise, at 320, forming a plurality of transducer elements which, for example, each comprise a respective piezoelectric element and respective electrodes and interconnects. In an embodiment, the forming at 320 includes, for each of a plurality of transducer elements, forming on a first side of the support layer an electrode of the transducer element and a piezoelectric element of the transducer element, and further forming in the support layer an interconnect of the transducer element, wherein the interconnect is coupled to the electrode of the transducer element. By way of illustration and not limitation, for each of the plurality of transducer elements, forming the transducer element may include forming on the first side of the support layer a reference electrode and a drive/sense electrode, and forming in the support layer a reference interconnect and a drive/sense interconnect. As illustrated in FIGS. 2F, 2G, for example, a reference interconnect and a drive/sense interconnect of a transducer element may couple, respectively, to a reference electrode and a drive/sense electrode of that transducer element.

Method 300 may further comprise, at 330, thinning the support layer—e.g. after forming the plurality of transducer elements at 320—to expose a second side of the support layer. The support layer may be thinned at 330 to a total thickness equal to or less than 35 microns, for example. In some embodiments, the support layer is thinned at 330 to a total thickness equal to or less than 30 microns.

In an embodiment, thinning the support layer at 330 includes, for each of the plurality of transducer elements formed at 320, exposing a respective opening for a spanning void which extends through the support layer. In an embodiment, the respective piezoelectric elements of the plurality of transducer elements each span a distance between respective sidewalls of the support layer, the distance comprising a spanning void. Alternatively or in addition, respective interconnects of the plurality of transducer elements may each extend through the support layer between the first side of the support layer and the second side of the support layer. For example, thinning the support layer at 330 may include exposing respective reference interconnects and/or drive/sense interconnects of the plurality of transducer elements.

Method 300 further comprises, at 340, bonding the exposed second side of the support layer to a flexible layer. In an embodiment, the flexible layer comprises a polymer material and, for each of respective interconnects of the plurality of transducer elements formed at 320, a corresponding interconnect extending through the flexible layer. The polymer material may include polyimide, for example. The support layer and transducer elements may be initially formed on a different wafer than one on which the flexible layer is initially formed. In an embodiment, bonding the second side to the flexible layer at 340 may include adhering with an adhesive including conductive fillers. In another embodiment, the bonding at 340 may be with a eutectic bond.

Although certain embodiments are not limited in this regard, method 300 may comprise forming one or more flexural structures between a first transducer element and a second transducer element. Such a flexural structure may separate portions of the support layer from one another—e.g. where the flexural structure includes a channel which extends through the support layer between the first and second sides of the support layer. In an embodiment, a plurality of flexural structures may be formed each between a respective pair of the plurality of transducer elements. For example, the plurality of flexural structures may include channels each formed between respective rows of transducer elements. In an embodiment, such a plurality of flexural structures may include a first channel through the support layer and a second channel through the support layer, wherein the first channel and the second channel extend along respective lines of direction which intersect one another.

Figure 4A:
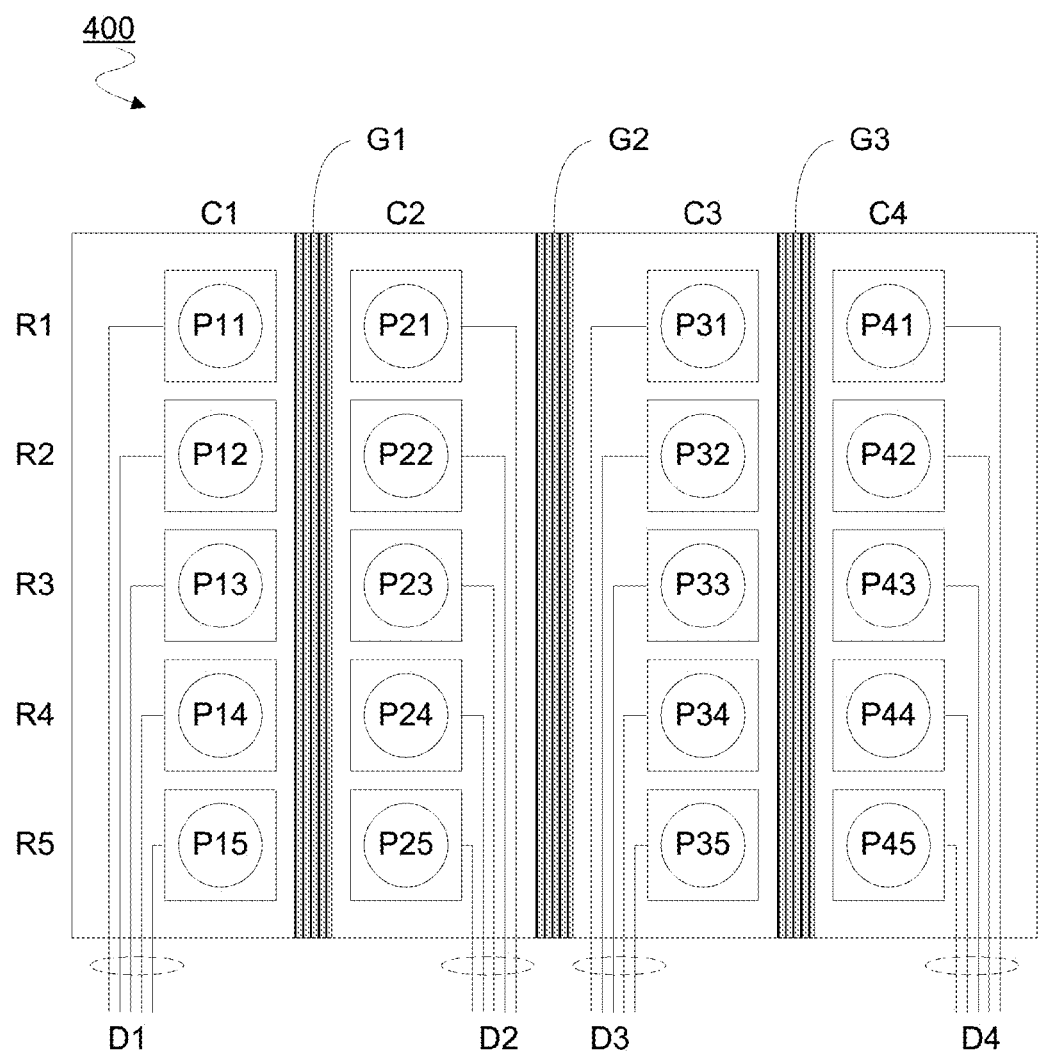
FIG. 4A is a layout diagram illustrating elements of a flexible transducer array according to an embodiment.

FIG. 4A illustrates elements of a flexible 2D pMUT array 400 according to an embodiment. Array 400 may include some or all of the features of one of the transducer arrays shown in FIGS. 2M-2P, for example.

In an embodiment, array 400 may comprise a plurality of transducer elements, as represented by the illustrative twenty (20) transducer elements P11-P15, P21-P25, P31-P35, P41 -P45 and P41-45. The transducer elements of array 400 may be distributed in rows and columns, as represented by the illustrative rows R1-R5 along an x-dimension and columns C1-C4 along a y-dimension.

One or more channels—e.g. including the illustrative channels G1, G2, G3—may be formed in (e.g. through) the support layer of array 400. Such a channel may serve as a flexural structure to allow for flexibility of array 400. For example, such a flexural structure may facilitate flexibility for the transducer array 400 to conform to a non-planar surface. As a result, such a transducer array may be fit onto a curved sensor surface, for example. The channels G1, G2, G3 may function as breaking lines in the support layer, where the array is mechanically supported at the breaking line by the underlying polymer (e.g. polyimide) layer. In an embodiment, an additional polymer layer (not shown) may be built on the back of the first polymer layer—e.g. the additional polymer layer including conductive connections for directing reference potential and/or signal lines to other test equipment circuitry.

For example, array 400 may include sets of signal lines D1-D4—e.g. including drive/sense signal lines and/or reference voltage lines—which variously extend under the flexible layer and couple to respective interconnect contacts disposed on a surface of the flexible layer. Signal lines D1-D4 are shown as variously extending along respective ones of columns C1-C4, although certain embodiments are not limited in this regard. In an embodiment, the channels G1, G2, G3 and signal lines D1-D4 are on opposite sides (e.g. front and back) of array 400.

Figure 4B:
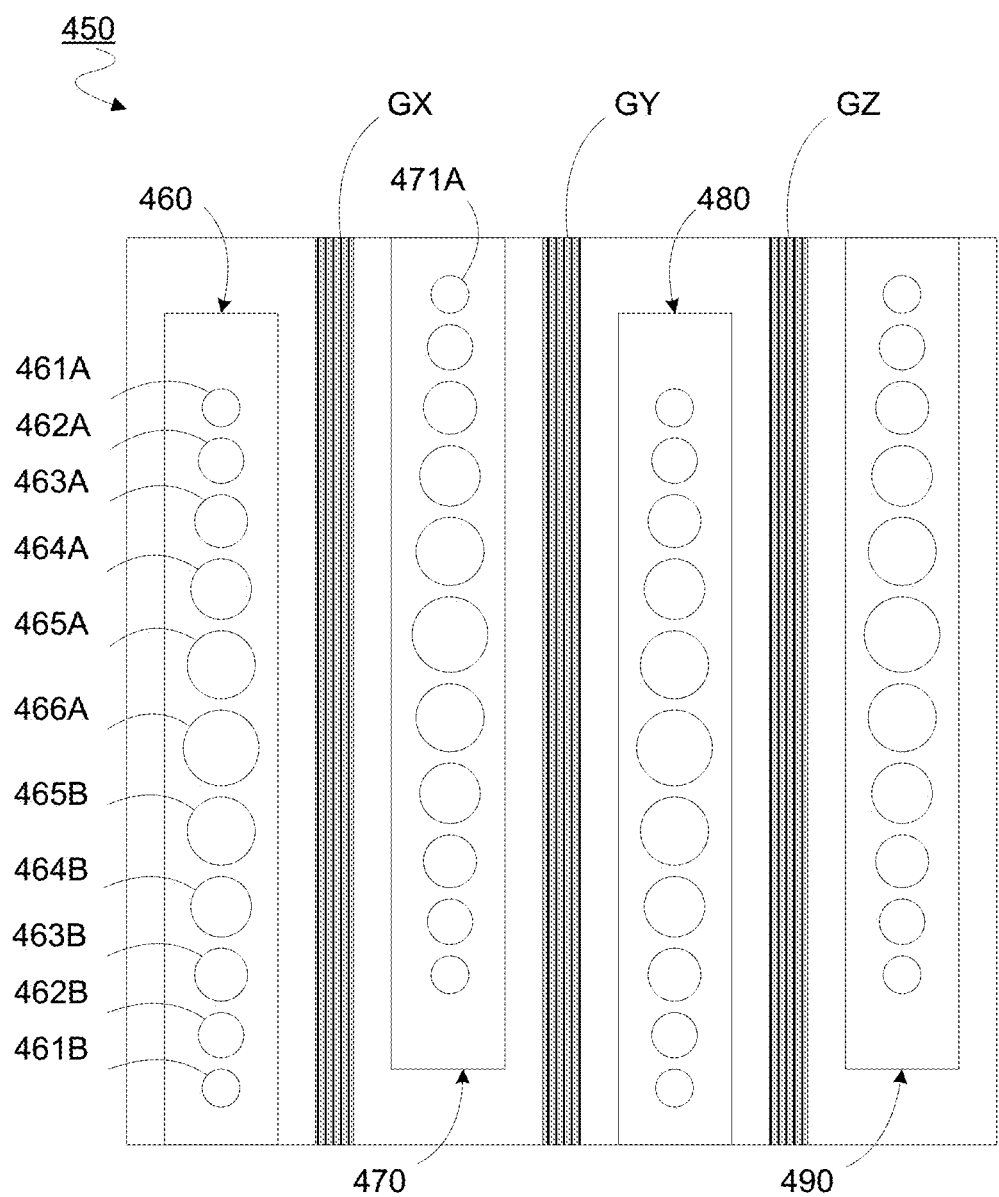
FIG. 4B is a layout diagram illustrating elements of a flexible transducer array according to an embodiment.

FIG. 4B is a plan view of a multi-mode MUT array 450, in accordance with an embodiment. The array 450 includes a plurality of electrode rails 460, 470, 480, 490 disposed over an area defined by a first dimension, x and a second dimension y, of a substrate 450. Each of the drive/sense electrode rails (e.g., 460) is electrically addressable independently from any other drive/sense electrode rails (e.g., 470 or 480) and are, functionally, separate channels of the array 450. One or more channels—e.g. including the illustrative channels GX, GY, GZ—may be formed in (e.g. through) a support layer of array 405 between variously respective ones such electrode rails.

Each channel has a characteristic frequency response that is a composite of the responses from individual transducer elements within the channel. A drive/sense electrode for each channel is electrically coupled in parallel to each element. For example in FIG. 4B, transducer elements 461A, 462A, 463A, etc. are coupled together to be electrically driven by the drive/sense electrode rail 460 (e.g. via respective structures corresponding functionally to bottom electrode 236). Similarly, all transducer elements (e.g. including 471A) of another channel are all coupled together in parallel to the drive/sense electrode rail 470. Generally, any number of transducer elements may grouped together within a channel—e.g. as a function of membrane diameters, element pitches and substrate area allocated for each channel.

In an embodiment, at least one membrane dimension varies across elements of a same channel of the apparatus. Such variation within a channel and/or between channels may provide for ultra wide-band operational characteristics of array 405. As illustrated in FIG. 4B, the circular membrane diameters vary along at least one dimension of the substrate (e.g., y-dimension) such that each channel includes a range of membrane sizes. In the depicted embodiment of array 450, each channel includes the same number of membranes of a particular size and a same number of different sizes. As resonance frequency is a function of membrane size (with a higher frequency associated with smaller membrane size), when a given electrical drive signal is applied to a channel, a particular frequency response is induced, or when a given frequency response is returned through a media, it generates a particular electrical sense signal. For the embodiment depicted in FIG. 4B, where each channel has the same population of elements (same number and size distribution), and a same spatial layout, each channel can be expected to have very nearly the same frequency response. Alternatively, channels with differing element populations (i.e., a different number of membrane sizes, different number of membranes of a particular size, or different spatial arrangements over the substrate) can be expected to have significantly different frequency responses.

As depicted in FIG. 4B, transducer element 111A a first size (e.g., smallest diameter membrane) is adjacent to element 112A of a second size (e.g., next larger diameter membrane) with the membrane size gradually increasing in a step-wise manner through a first series of elements with ever increasing membrane size and then a second series with stepwise decreasing size back to the smallest diameter. FIG. 4B provides that each element with some channel population is adjacent to another element of the same size or of a next smallest or next largest size for any number of different membrane sizes (e.g., three, four, or five different sizes depicted in FIG. 4B, etc.).

Figure 5:
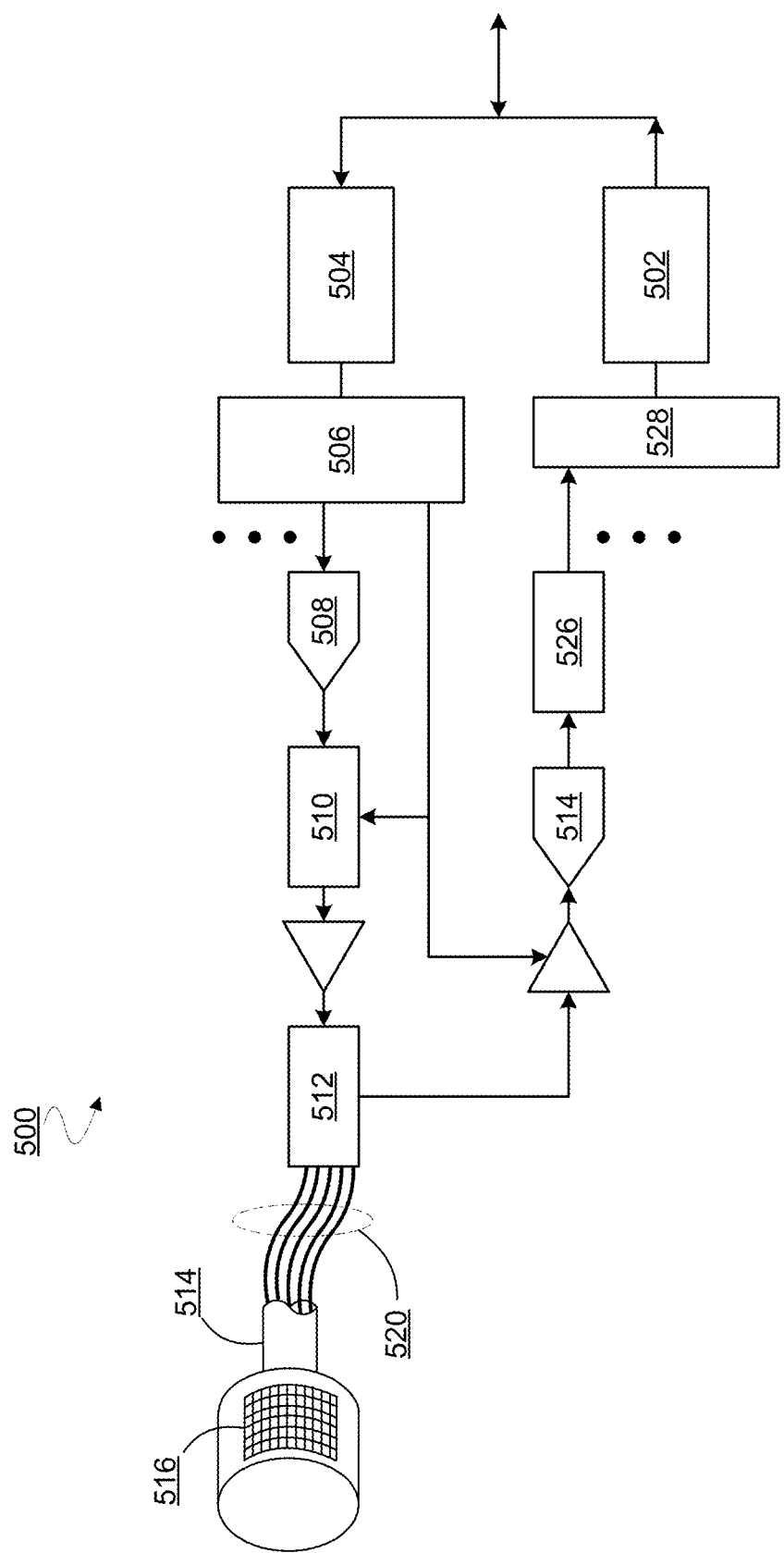
FIG. 5 is a functional block diagram illustrating elements of an ultrasonic transducer apparatus that employs a flexible transducer array according to an embodiment.

FIG. 5 is a functional block diagram of an ultrasonic transducer apparatus 500 that employs a flexible transducer array, in accordance with an embodiment. In an exemplary embodiment, the ultrasonic transducer apparatus 500 is for generating and sensing pressure waves in a medium, such as water, tissue matter, etc. The ultrasonic transducer apparatus 500 has many applications in which imaging of internal structural variations within a medium or multiple media is of interest, such as in medical diagnostics, product defect detection, etc. The apparatus 500 includes at least one transducer array 516, which may be any of the flexible transducer arrays described elsewhere herein. In exemplary embodiment, the transducer array 516 is housed in a handle portion 514 which may be manipulated by machine or by a user of the apparatus 500 to change the facing direction and location of the outer surface of the transducer array 516 as desired (e.g., facing the area(s) to be imaged). Electrical connector 520 electrically couples drive/sense electrodes of the transducer array 516 to a communication interface external to the handle portion 514.

In embodiments, the apparatus 500 includes at least one signal generator, which may be any known in the art for such purposes, coupled to the transducer array 516, for example by way of electrical connector 520. The signal generator is to provide an electrical drive signal on various drive/sense electrodes. In an embodiment, each signal generator includes a de-serializer 504 to de-serialize control signals that are then de-multiplexed by demux 506. The exemplary signal generate further includes a digital-to-analog converter (DAC) 508 to convert the digital control signals into driving voltage signals for the individual transducer element channels in the transducer array 516. Respective time delays can be added to the individual drive voltage signal by a programmable time-delay controller 510 to beam steer, create the desired beam shape, focus, and direction, etc. Coupled between the pMUT channel connector 502 and the signal generator is a switch network 512 to switch the transducer array 516 between drive and sense modes.

In embodiments, the apparatus 500 includes at least one signal receiver, which may be any known in the art for such purposes, coupled to the transducer array 516, for example by way of electrical connector 520. The signal receiver(s) is to collect an electrical response signal from each the drive/sense electrode channels in the transducer array 516. In one exemplary embodiment of a signal receiver, an analog to digital converter (ADC) 514 is to receive voltages signals and convert them to digital signals. The digital signals may then be stored to a memory (not depicted) or first passed to a signal processor. An exemplary signal processor includes a data compression unit 526 to compress the digital signals. A multiplexer 518 and a serializer 528 may further process the received signals before relaying them to a memory, other storage, or a downstream processor, such as an image processor that is to generate a graphical display based on the received signals.

Techniques and architectures for providing a flexible transducer array are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A micromachined transducer array comprising:
   a plurality of transducer elements each comprising:
     a respective electrode disposed on a first side of a support layer including a bulk semiconductor material;
     a respective piezoelectric element disposed on the first side of the support layer; and
     a respective interconnect in the support layer coupled to the respective electrode of the transducer element, wherein the interconnect extends through the support layer between the first side and a second side of the support layer; and
   a flexible layer bonded by an adhesive material to the second side of the support layer, wherein the flexible layer includes a polymer material and, for each of the respective interconnects of the plurality of transducer elements, a corresponding interconnect extending through the flexible layer;
   wherein the adhesive material provides at least partial electrical isolation of the respective interconnects of the plurality of transducer elements from one another;
   wherein conductive fillers are disposed in the adhesive material; and
   wherein the respective interconnects of the plurality of transducer elements are each electrically coupled via the conductive fillers to the corresponding interconnect extending through the flexible layer.

2. The micromachined transducer array of claim 1, wherein a total thickness of the support layer between the first side and the second side is equal to or less than 100 microns.

3. The micromachined transducer array of claim 1, wherein the polymer material includes polyimide.

4. The micromachined transducer array of claim 1, wherein each of the plurality of transducer elements includes:
- a reference electrode disposed on the first side of the support layer;
- a drive/sense electrode disposed on the first side of the support layer;
- a reference interconnect in the support layer, the reference interconnect coupled to the reference electrode of the transducer element; and
- a drive/sense interconnect in the support layer, the drive/sense interconnect coupled to the drive/sense electrode of the transducer element.

5. The micromachined transducer array of claim 1, wherein the support layer further comprises a flexural structure between a first transducer element and a second transducer element.

6. The micromachined transducer array of claim 5, wherein the flexural structure separates portions of the support layer from one another.

7. The micromachined transducer array of claim 1, wherein the flexible layer is bonded to the second side of the support layer with a eutectic bond.

8. The micromachined transducer array of claim 1, wherein the flexible layer includes a first interconnect comprising a first portion to carry a signal laterally along the flexible layer.

9. An apparatus for generating and sensing pressure waves in a medium, the apparatus comprising:
- the micromachined transducer array of any of claims 1-4 and 5;
- generating means coupled to the micromachined transducer array to apply an electrical drive signal on at least one drive/sense electrode;
- receiving means coupled to the micromachined transducer array to receive an electrical response signal from at least one drive/sense electrode; and
- signal processing means coupled to the receiving means to process electrical response signals received from the plurality of the drive/sense electrodes.

10. The apparatus of claim 9, wherein the generating means is to apply an electrical drive signal to cause at least one piezoelectric element of the plurality of transducer elements to resonate at an ultrasonic frequency.

* * * * *